(12) United States Patent
Blanchard

(10) Patent No.: US 6,790,745 B1
(45) Date of Patent: Sep. 14, 2004

(54) FABRICATION OF DIELECTRICALLY ISOLATED REGIONS OF SILICON IN A SUBSTRATE

(75) Inventor: Richard A. Blanchard, Los Altos, CA (US)

(73) Assignee: JBCR Innovations, Dallas, TX (US)

(*) Notice: Subject to any disclaimer, the term of this patent is extended or adjusted under 35 U.S.C. 154(b) by 0 days.

(21) Appl. No.: 10/736,040

(22) Filed: Dec. 15, 2003

(51) Int. Cl.⁷ .......................... H01L 21/76; H01L 29/00
(52) U.S. Cl. ...................... 438/422; 438/222; 257/374
(58) Field of Search .................. 438/400–413, 438/429, 218–222; 257/522–524, 374

(56) References Cited

U.S. PATENT DOCUMENTS

| | | | |
|---|---|---|---|
| 4,592,802 A | 6/1986 | Deleonibus et al. | |
| 4,824,795 A | 4/1989 | Blanchard | |
| 4,920,639 A | 5/1990 | Yee | |
| 5,891,797 A | 4/1999 | Farrar | |
| 6,020,215 A | 2/2000 | Yagi et al. | |
| 6,060,381 A | 5/2000 | Nakagawara et al. | |
| 6,166,436 A | 12/2000 | Maeda et al. | |
| 6,204,098 B1 | 3/2001 | Anceau | |
| 6,277,703 B1 * | 8/2001 | Barlocchi et al. | 438/412 |
| 6,331,470 B1 | 12/2001 | Sanfilippo et al. | |
| 2001/0049200 A1 * | 12/2001 | Erratico et al. | 438/701 |

OTHER PUBLICATIONS

Kelly, et al., Galvanic Cell Formation: A Review of Approaches to Silicon Etching for Sensor Fabrication, Aug. 2001, IEEE Sensors Journal, vol. 1, No. 2, p. 127–142.

Lee, The Fabrication of Thin, Freestanding, Single–Crystal, Semiconductor Membranes, Aug. 1990, J. Electochem. soc., vol. 137, No. 8,p. 2556–2574.

* cited by examiner

Primary Examiner—Metthew Smith
Assistant Examiner—Calvin Lee
(74) Attorney, Agent, or Firm—Richard K. Robinson

(57) ABSTRACT

A method for manufacturing a semiconductor device comprising of the steps of creating an oxide layer on a first surface of an epitaxial layer having damage layer located at a predetermined depth from the first surface, the damaged layer being in parallel alignment with the first surface. Then, using the oxide layer as a masked, etch the epitaxial layer to create a plurality of pillars, the plurality of pillars being enclosed in a first area of the top surface of the epitaxial layer, the first area having a predefine perimeter and the plurality of pillars being separated from each other by inner trenches and from the perimeter by a perimeter trench, the inner trenches and perimeter trench extend from the first surface to at least the predetermined depth of damaged layer. Form an oxide layer that coats the pillars, fills the perimeter trench and coats the sides and bottoms of the inner trenches prior to removing the oxide layer from at least the sidewalls and bottom of the inner trenches. Then etch with an etchant that etches preferentially the damaged layer, and grow a layer of silicon dioxide to replace the damaged layer.

52 Claims, 20 Drawing Sheets

FABRICATION OF DIELECTRICALLY ISOLATED REGIONS OF SILICON IN A SUBSTRATE

BACKGROUND OF THE INVENTION

The invention relates a method for manufacturing semiconductor devices and more particular to a method for manufacturing smiconductor devices having isolated regions of silicon in a substrate.

Dielectrically isolation or "D.I." Technology may be used to fabricate a variety of circuits with characteristics that cannot be obtained when using pn-junctions for isolation. Circuits that withstand high voltage, circuits that are resistant to high doses of radiation, and circuits that include radiation sensors such as photodiodes that are connected in series are examples. Unfortunately, the manufacturing techniques used to obtain dielectrically isolated regions are relatively expensive, so this technology has not been a cost effective option for many applications.

SUMMARY OF INVENTION

A new technique for obtaining dielectrically isolated regions of silicon in a substrate is disclosed. This technique differs from, and is less expensive than conventional approaches. This technique is used to form a layer of silicon dioxide below the isolated regions of silicon having a thickness that is selected from a relatively wide range. In a similar fashion, the thickness of the single crystal silicon layer that is dielectrically isolated is selected from a wide range to match the application. One version of this technique is described and shown in FIGS. 1 through 14. These figures show the use of an ion implantation step, which permanently damages the silicon to obtain regions of silicon that are subsequently etched away in the fabrication sequence. Argon ions are used to obtain damaged regions in silicon without doping it. Boron or indium ions are used if p-type doping of the silicon is acceptable, and phosphorus arsenic, or antimony are used if n-type doping of the silicon is acceptable. Ions of other atoms may be used as long as these ions create a damaged layer in the silicon without causing any other problems. It may also be possible to use oxygen or nitrogen implants at doses below those required to form a layer of $SiO_2$ or $Si_3N_4$ or to use conventional thermal predeposition steps to obtain a damaged layer.

One of two different techniques is used to form the layer of $SiO_2$ below the regions of single crystal silicon. The damaged silicon may be etched directly, using an etchant that preferentially etches the damaged silicon, or heavily doped n-type silicon may be converted to "porous" silicon using an anodization process. (This process is described in the article "Galvanic Cell Formation: A review of Approaches to Silicon Etching for Sensor Fabrication," by J. J. Kelly, X. H. Xia, C.M.A. Ashruf and P. J. French, *IEEE Sensors Journal*, Vol. 1, No. 2 (2001) pp. 127–142, incorporated herein by reference.)

As shown in FIGS. 1–14, the region of damaged silicon is preferentially removed later in the process, leaving a horizontal opening that is subsequently filled with silicon dioxide using thermal oxidation. The silicon region above the etched horizontal layer is held in place by material present in the perimeter trench, which is firmly attached to the silicon on both its inside and its outside walls.

The use of trenches with different widths allows the perimeter trench or the trenches along one axis to be completely filled, while the internal trenches or the trenches along the other orthogonal axis are not filled by the layer material or combination of materials that is grown and/or deposited following trench formation. Other combinations of trenches having different widths allow two-dimensional arrays of isolated single crystal regions of silicon to be formed. The only requirements are that the silicon must be removed from beneath the islands, and the islands must be held in place along at least one sidewall after the damaged silicon below the island is removed.

The use of the ion implantation step in FIG. 2 to produce damaged silicon may be replaced by performing a conventional thermal predeposition or ion implantation to produce a heavily doped region if an etchant with a sufficiently high selectivity ratio for heavily doped silicon is used. The first three steps of this second version of this technique differ from those shown in FIGS. 1–3. These steps are shown in FIGS. 15–17. Following step 4 in FIG. 4, steps 5 through 13 of the first embodiment are completed, resulting in essentially the same structure shown in cross section FIG. 13 and from the top in FIG. 14.

Alternately, the formation of the porous silicon as is taught in the incorporated reference may be used to remove a heavily doped n-type region that has been formed below the regions of single crystal silicon that are to be isolated. After the porous silicon is formed, the wafer is oxidized using an atmosphere containing water vapor, forming silicon dioxide. This silicon dioxide layer is next remove using an etchant containing HF. Finally, the wafer is oxidized, forming a layer of silicon dioxide on each silicon surface thick enough to fill the regions below and around each pillar of silicon.

The resulting semiconductor structure may be used in many application requiring isolated regions. In power ICs the power transistor may be placed on the isolated region and the control logic on non-isolated regions or visa versa. Similarly, in high frequency circuits the high frequency portion may be fabricated on the isolated pillars. The same techniques also apply to high-speed digital circuits. Finally the isolated islands may be use as charge storage elements.

FIGS. 6 and 14 show examples of the shapes of the dielectrically isolated regions that may be obtained. It is also possible to obtain square or rectangular areas of silicon that are dielectrically isolated having only perimeter trenches.

A number of other variations on this technique also exist. These variations include:

1. The formation of a dielectrically isolated layer of silicon without growing an epitaxial layer: The implant energy, implant dose, the atoms species used, and the details of any anneal determine the depth at which the damaged layer occurs. By using a high energy implanter or a relatively low mass ion, a thicker layer of silicon above the layer of silicon dioxide may be obtained. For some applications, this layer may be both thick enough and deep enough that no epitaxial deposition step is needed.
2. A wafer with a layer of silicon dioxide below the wafer surface that has been formed by ion implantation may be used as a starting point for this process. The thickness of the oxide layer may be increased to a value that is much greater than the one that can be obtained by the ion implantation of oxygen alone. The process steps of the first embodiment would be performed, but the ion implantation step would implant oxygen, forming a layer of silicon dioxide, before the rest of the steps in the first embodiment are performed. Variations of the specific steps may also be used without departing from the intention of this disclosure.

DETAILED DESCRIPTION OF THE EMBODIMENTS

Figure 1:
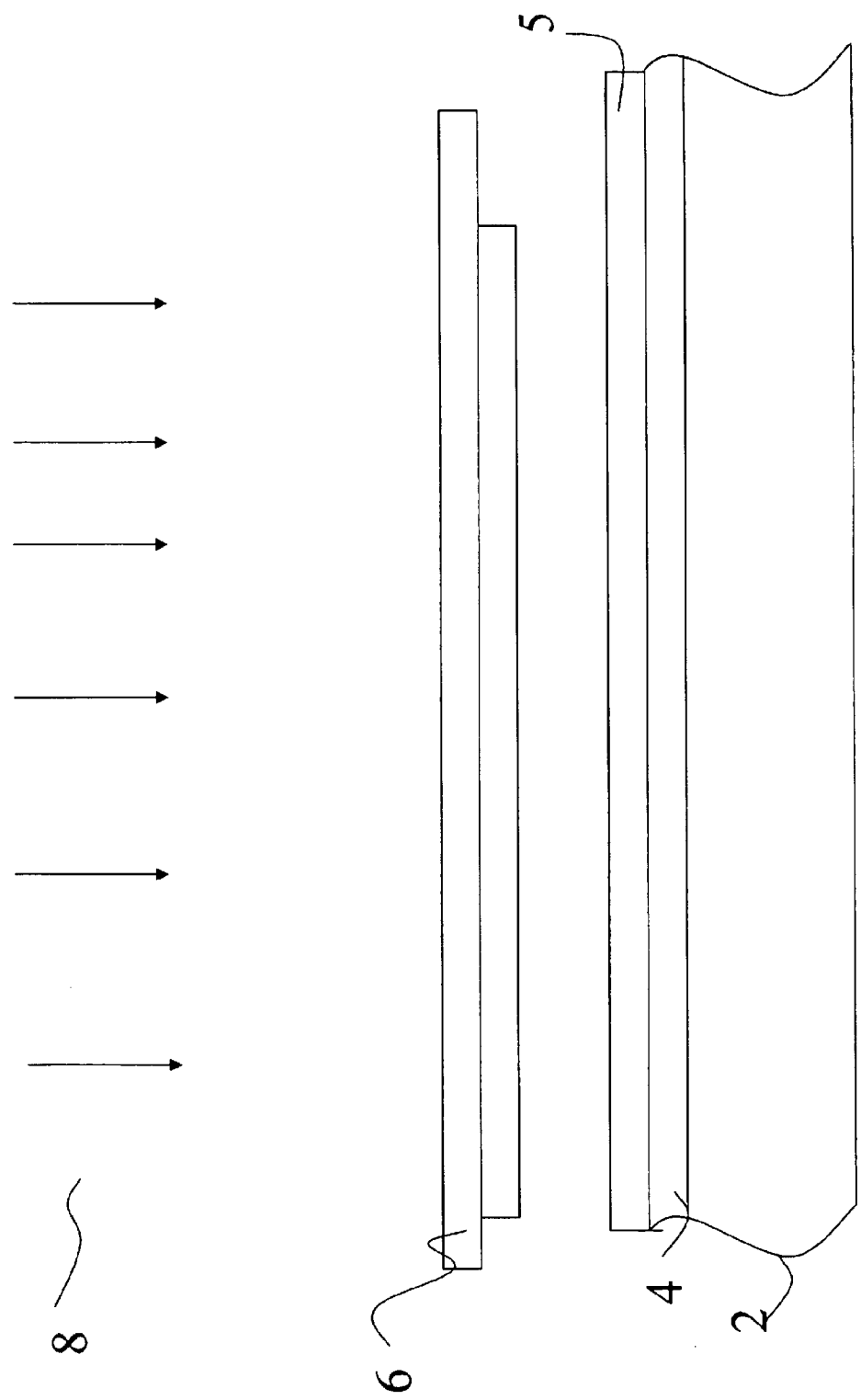
FIGS. 1–5 and 7–13 illustrate the steps that are to be performed according to one embodiment of the invention.

Referring to FIG. 1, a starting wafer 2 is optionally provided where an oxide layer 4 is grown on a top surface. The wafer and oxide are masked with a photoresist layer 5 and using the pattern provided by mask 6 and the radiation 8 from the aligner (not shown).

Figure 2:
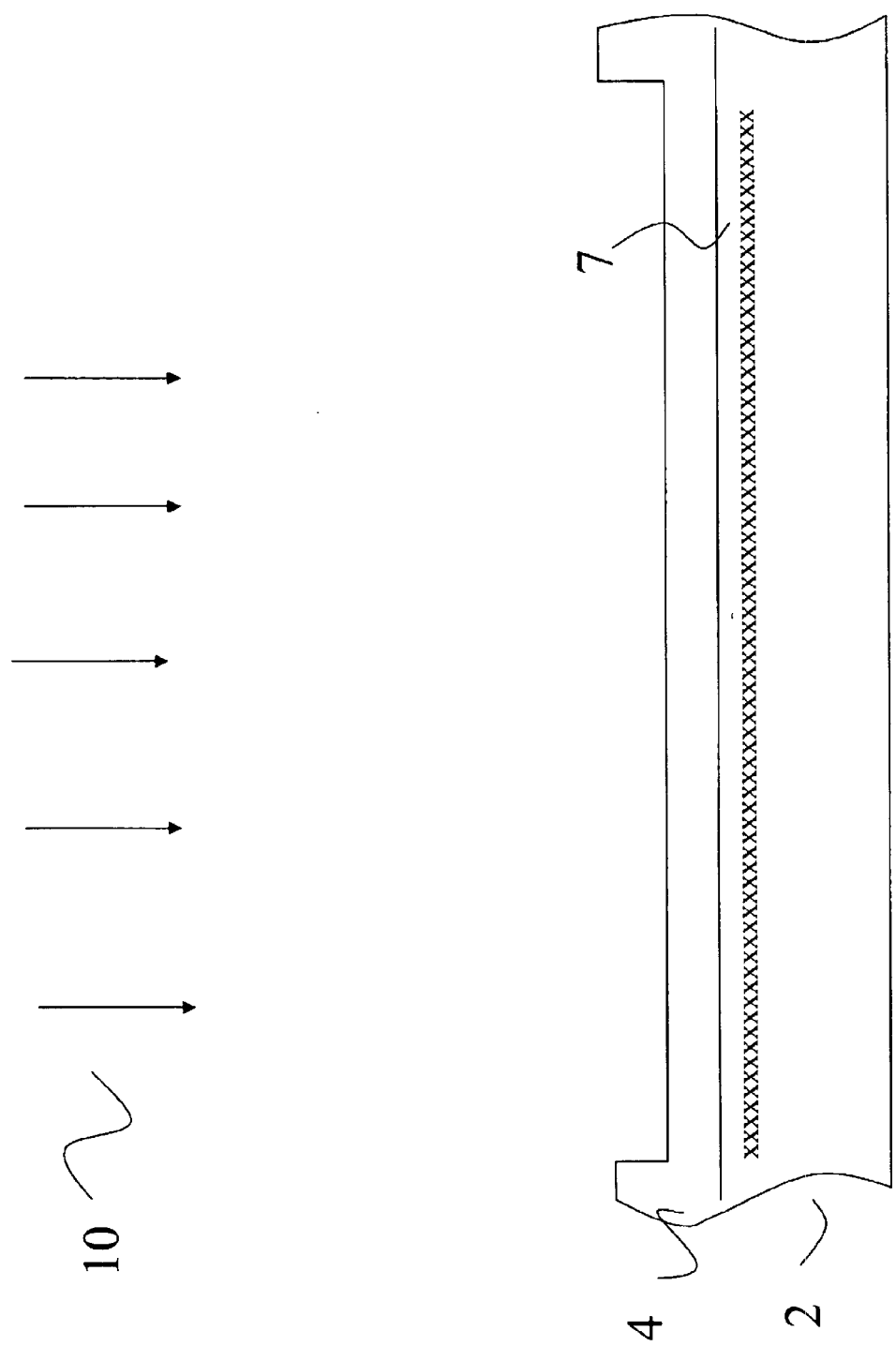

As shown in FIG. 2, the masked wafer is etched, the photoresist is removed, and the wafer is oxidized, forming oxide layer 4. Ions are implanted from a source 10 to create a damaged layer in the silicon wafer 2 as is shown at location 7. The dose required to damage the silicon is in the range of $5 \times 10^{14}$ per square centimeter or greater.

Figure 3:
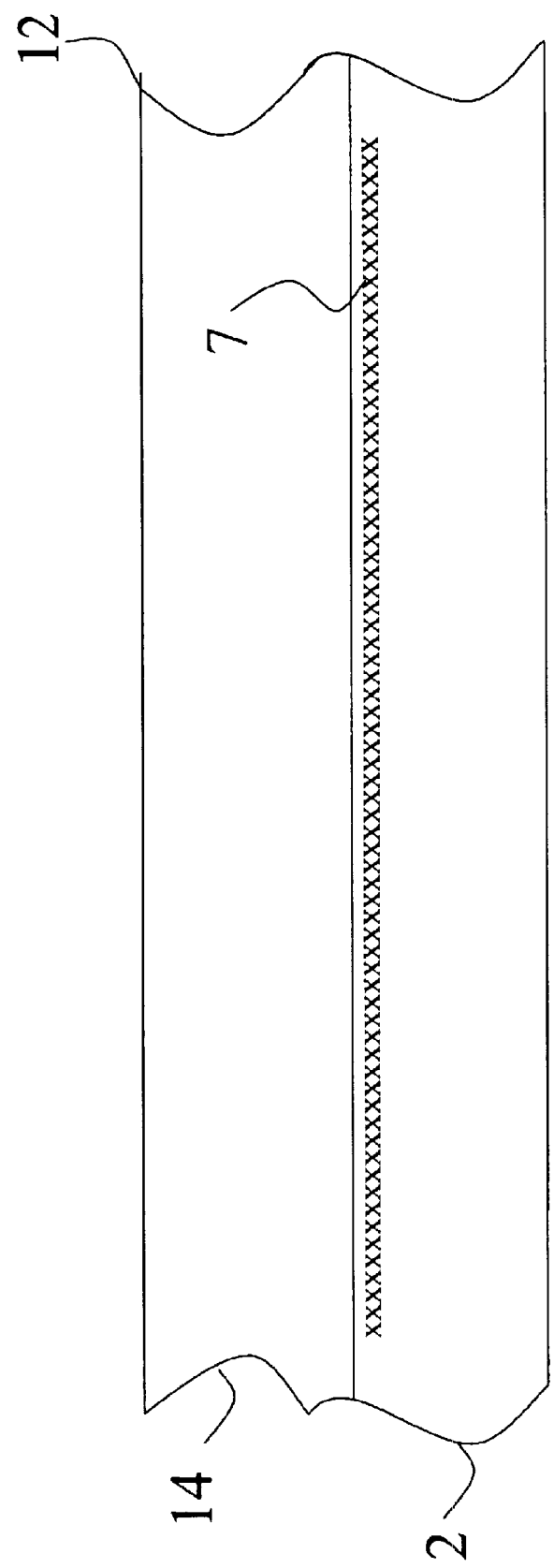

Proceeding to FIG. 3, the oxide layer is removed and a layer of epitaxial silicon is deposited on top of the wafer 2.

Figure 4:
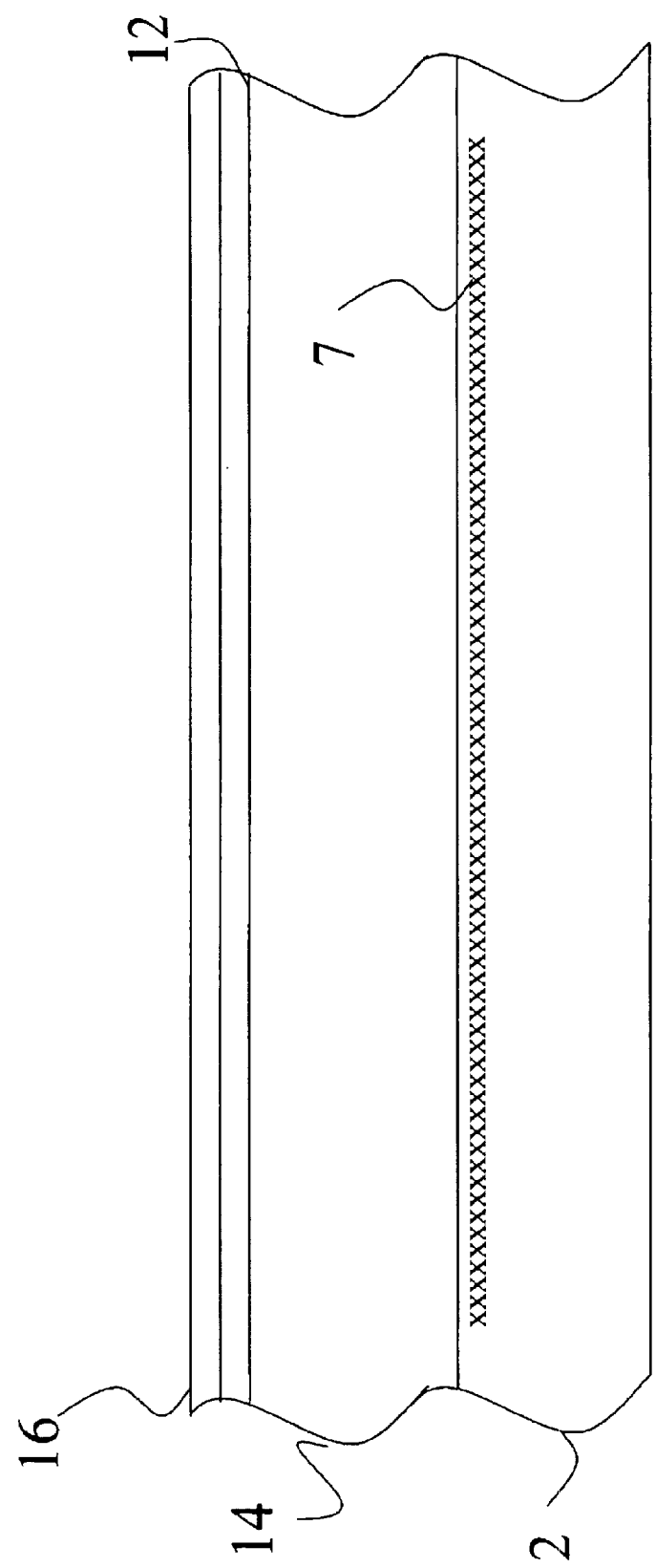

Proceeding to FIG. 4, the epitaxial layer 14 is oxidized to create an oxide layer 12, on top of which a nitride layer 16 is deposited. The deposition of the nitride layer 16 is an optional step.

Figure 5:
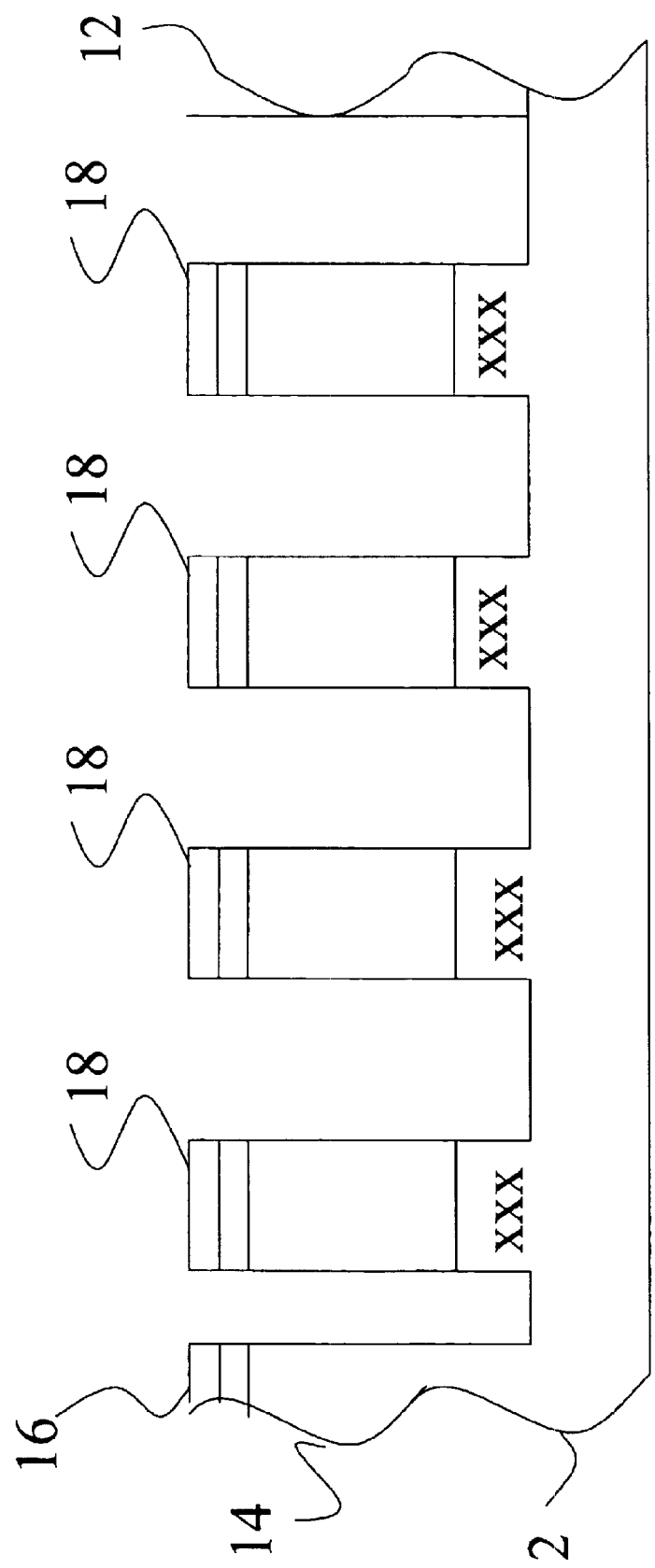

Referring to FIG. 5, following a photomask and etch step, and using the nitride oxide layer 16 as a mask, the perimeter and inner trenches are etched to a predetermined depth that is deeper than the layer of damaged silicon 7.

Figure 6:
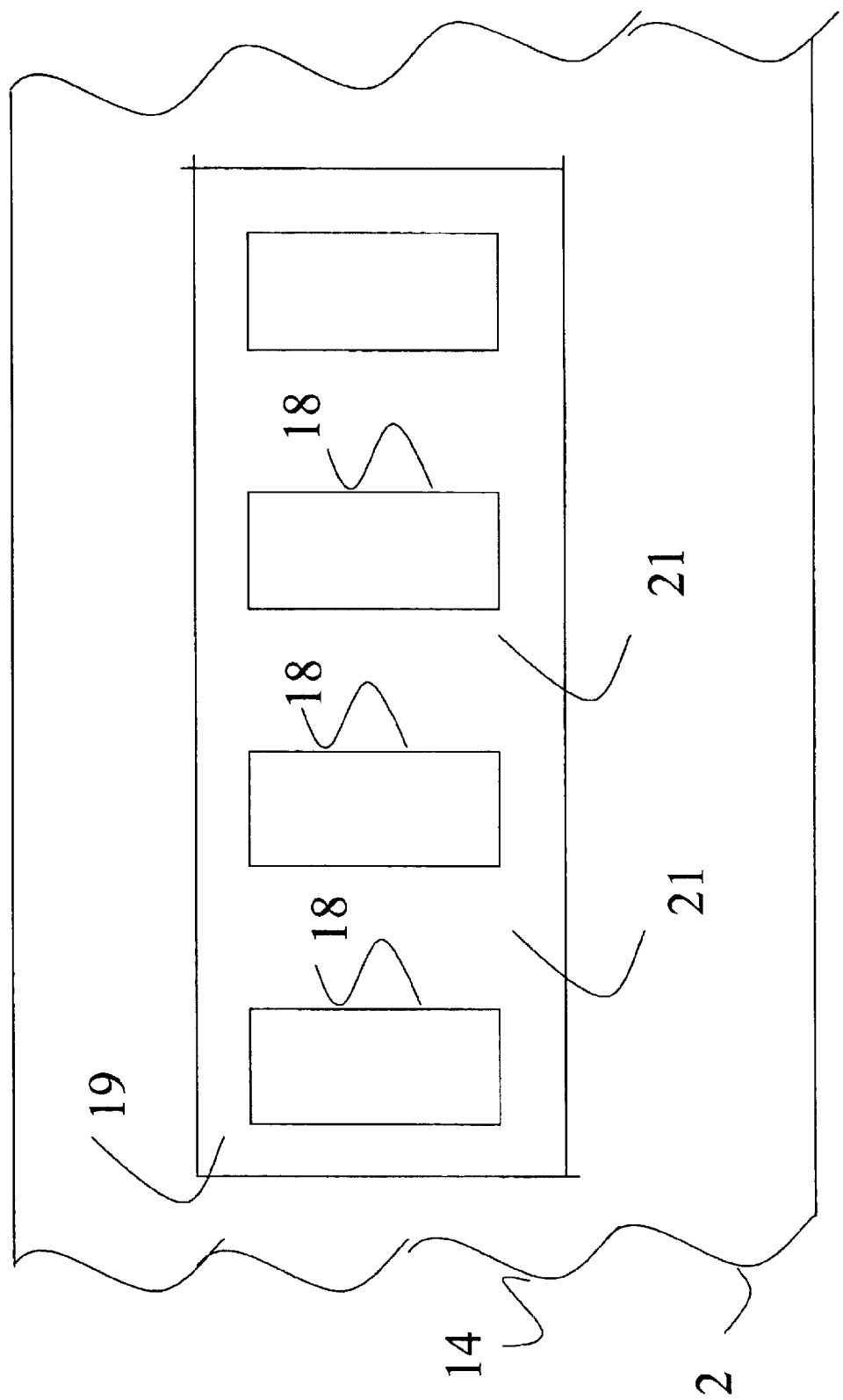
FIGS. 6 and 14 are top views of the embodiments.

Referring to FIG. 6, which is a top view of FIG. 5, the perimeter 18 surrounds a plurality of etched columns 18 and the columns 18 are separated from one another by internal trenches 21. As is shown in FIG. 5, the perimeter trench 19 and perimeter trenches 21 are etched to a depth that is deeper than the layer of damaged silicon 7.

Figure 7:
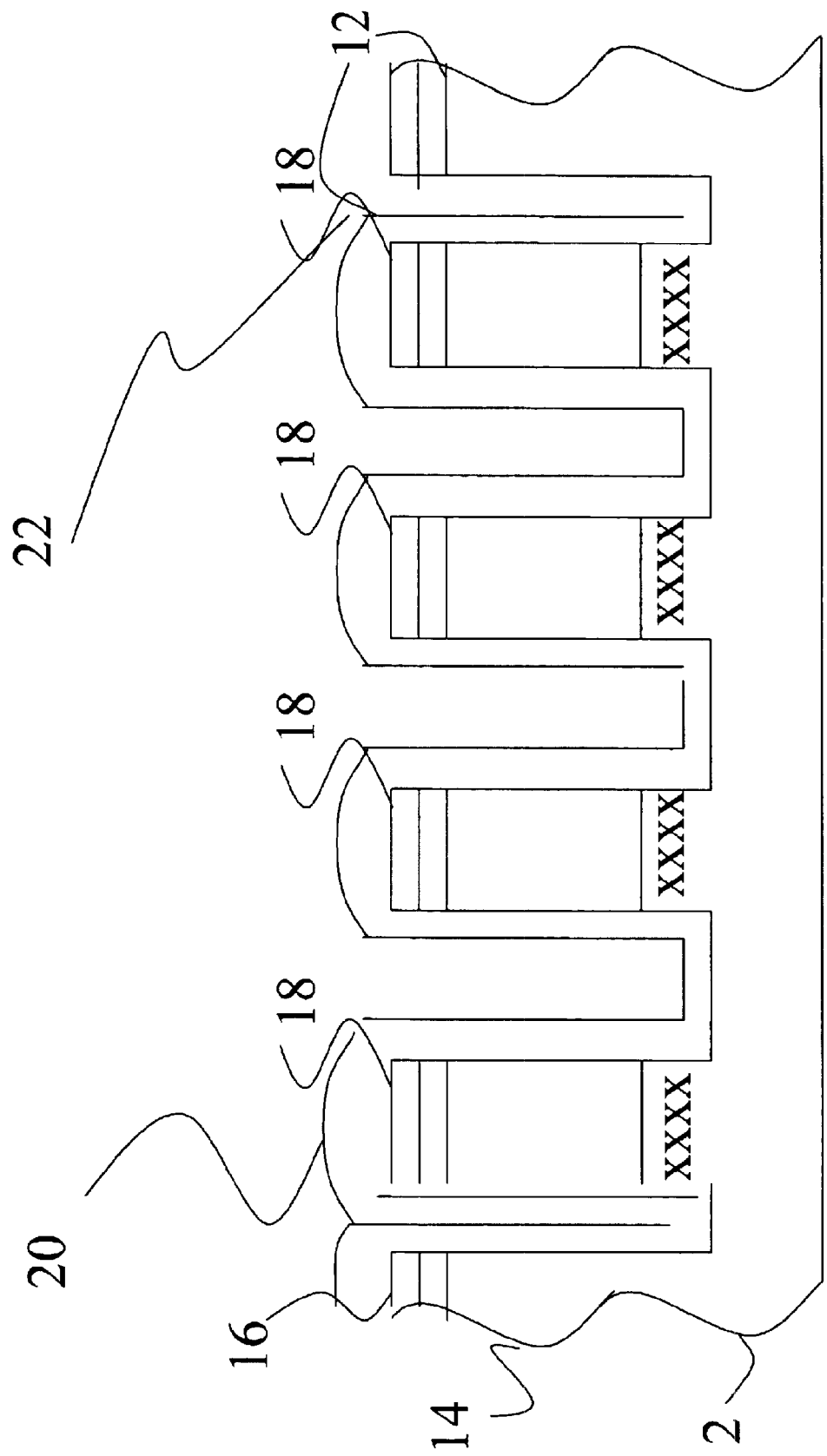

Proceeding to FIG. 7, a layer or combination of layers is formed that fills the perimeter trench 19, but only coats the sidewalls and bottoms of the internal trenches 21 with an insulator such as silicon dioxide. The layer 20 covers the tops and sides of the pillars 18 as well as the bottom of trenches 21. The perimeter trench 19 is filled, and as will be shown, will be used to support the pillars 18.

Figure 8:
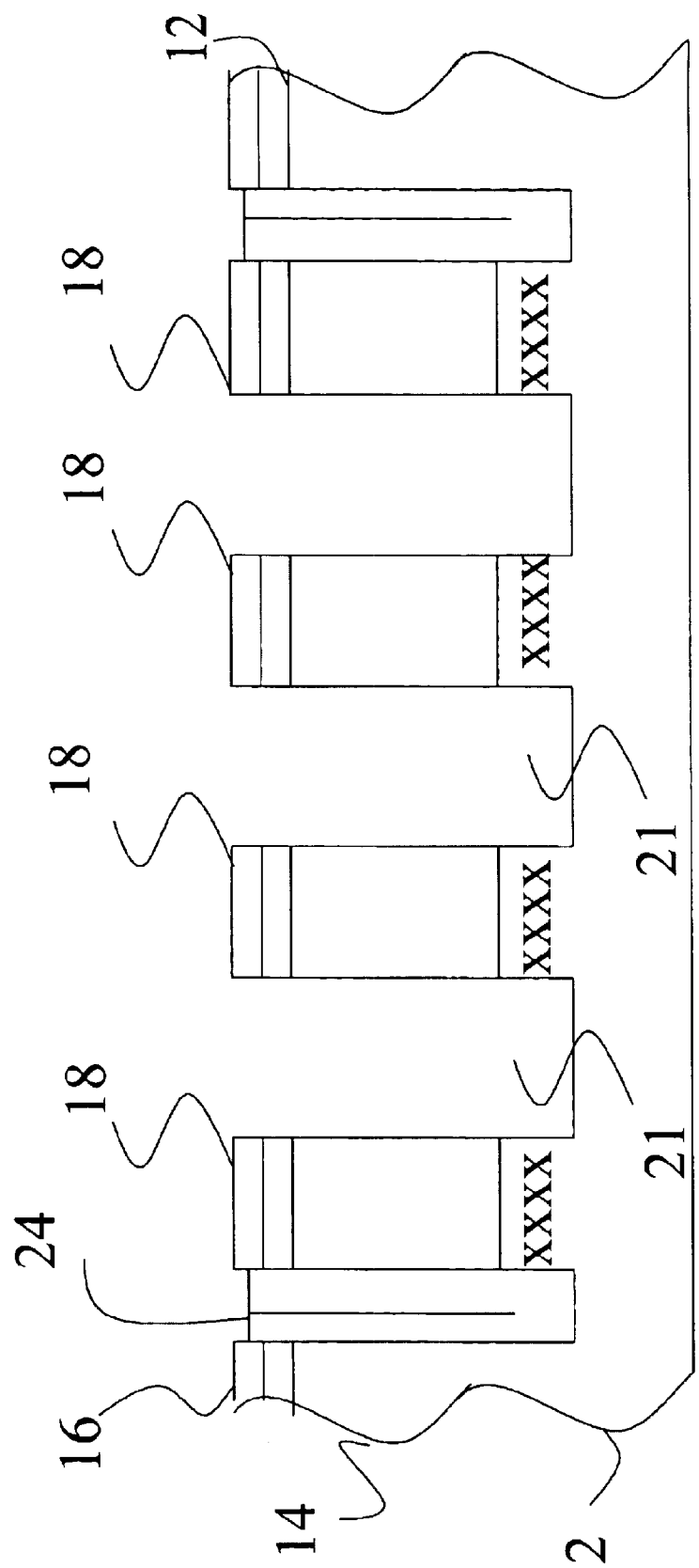

Proceeding to FIG. 8, an etchant is used without a mask, removing the deposited layer or layers from the sidewalls and bottoms of the internal trenches 21. The pillars, 18, are held in place by the oxide layer, 24, that is present around the perimeter. (Note: A mask could be used at this step, but it is not required.)

Figure 9:
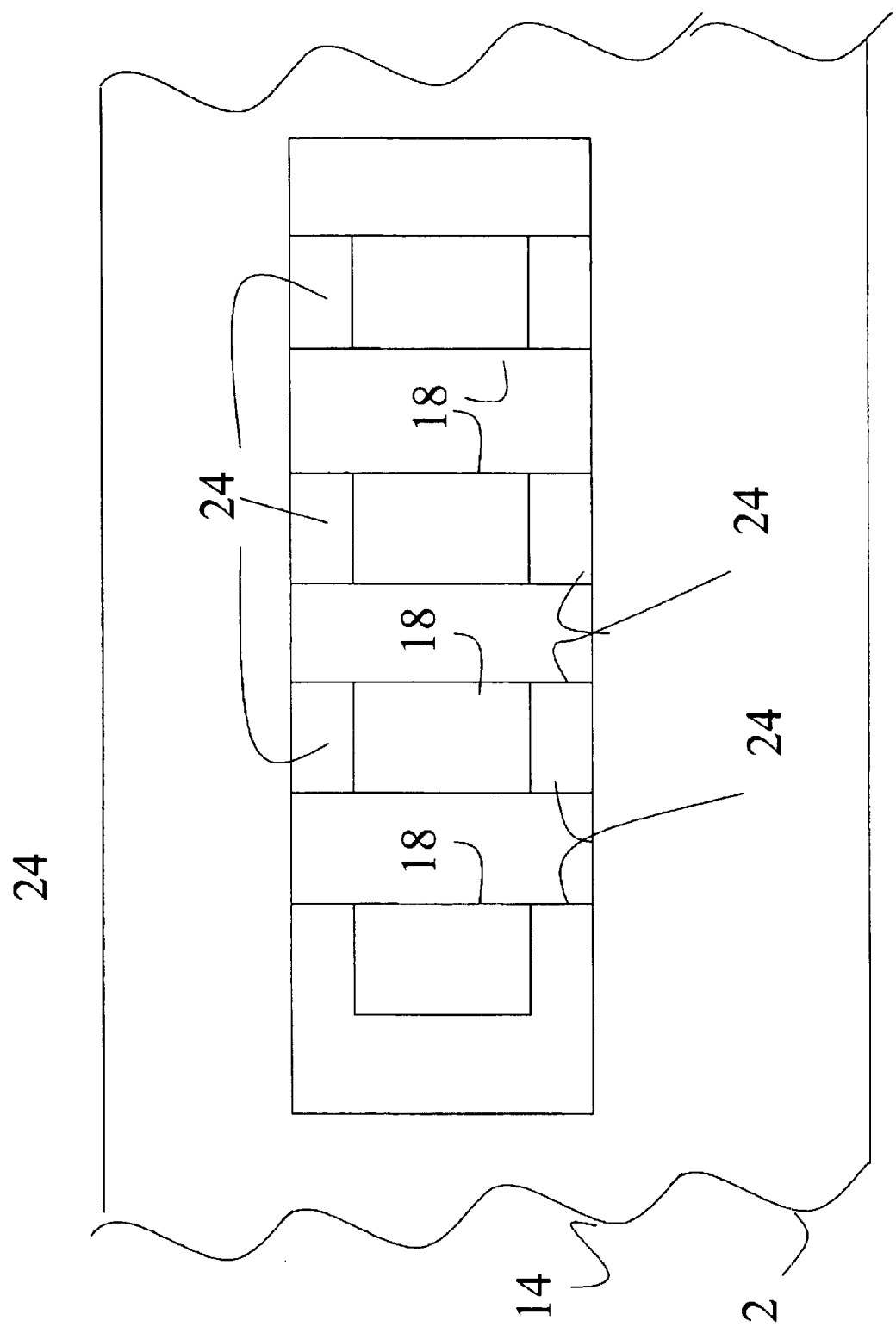

Proceeding to FIG. 9, a top view of the device of FIG. 8 is shown, where the oxide layer 24 supports each of the pillars 18.

Figure 10:
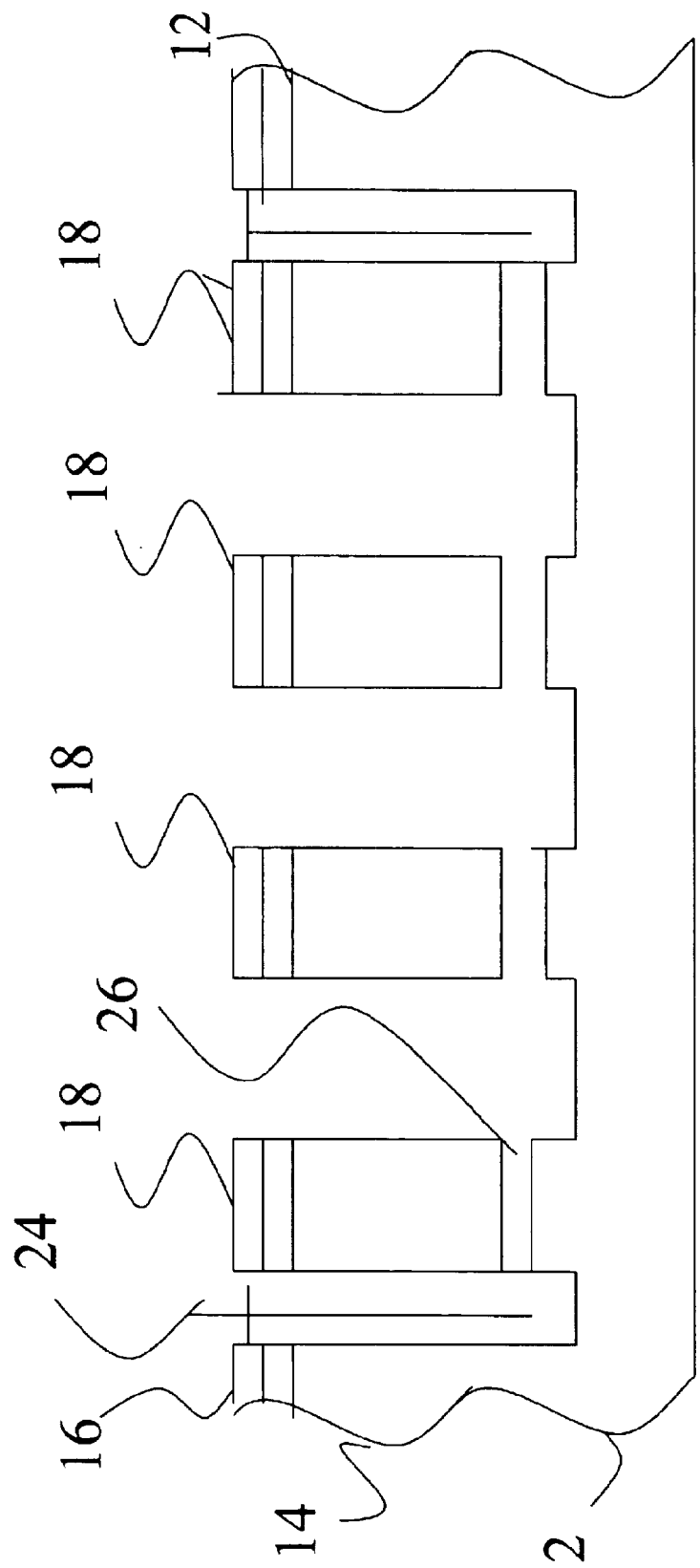

Referring to FIG. 10, using an etchant that preferentially etches damaged silicon, the damaged silicon is removed from the area 26 beneath each pillar 18.

Figure 11:
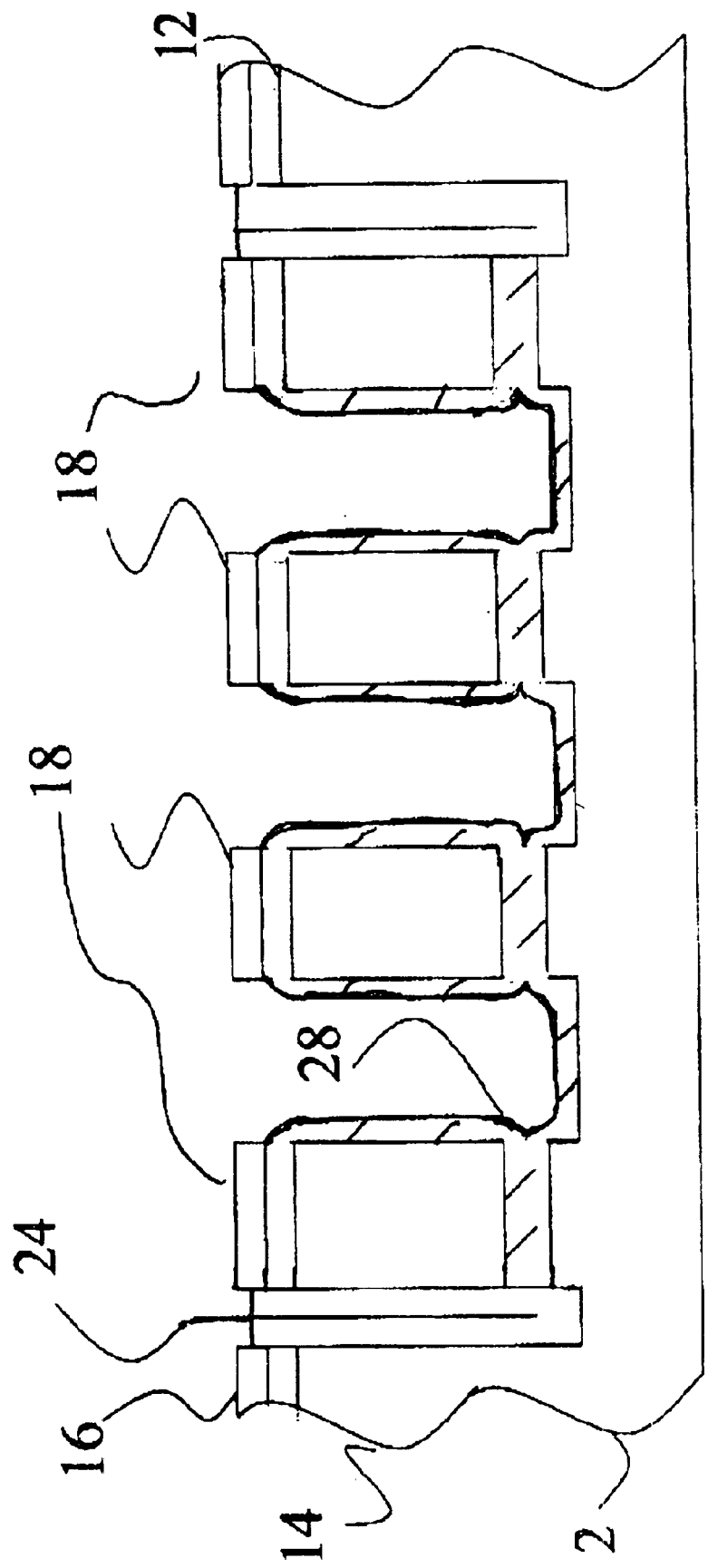

Proceeding to FIG. 11, thermal oxidation is used grow a layer of silicon dioxide to fill in the layer removed by etching, as is shown at area 28.

Figure 12:
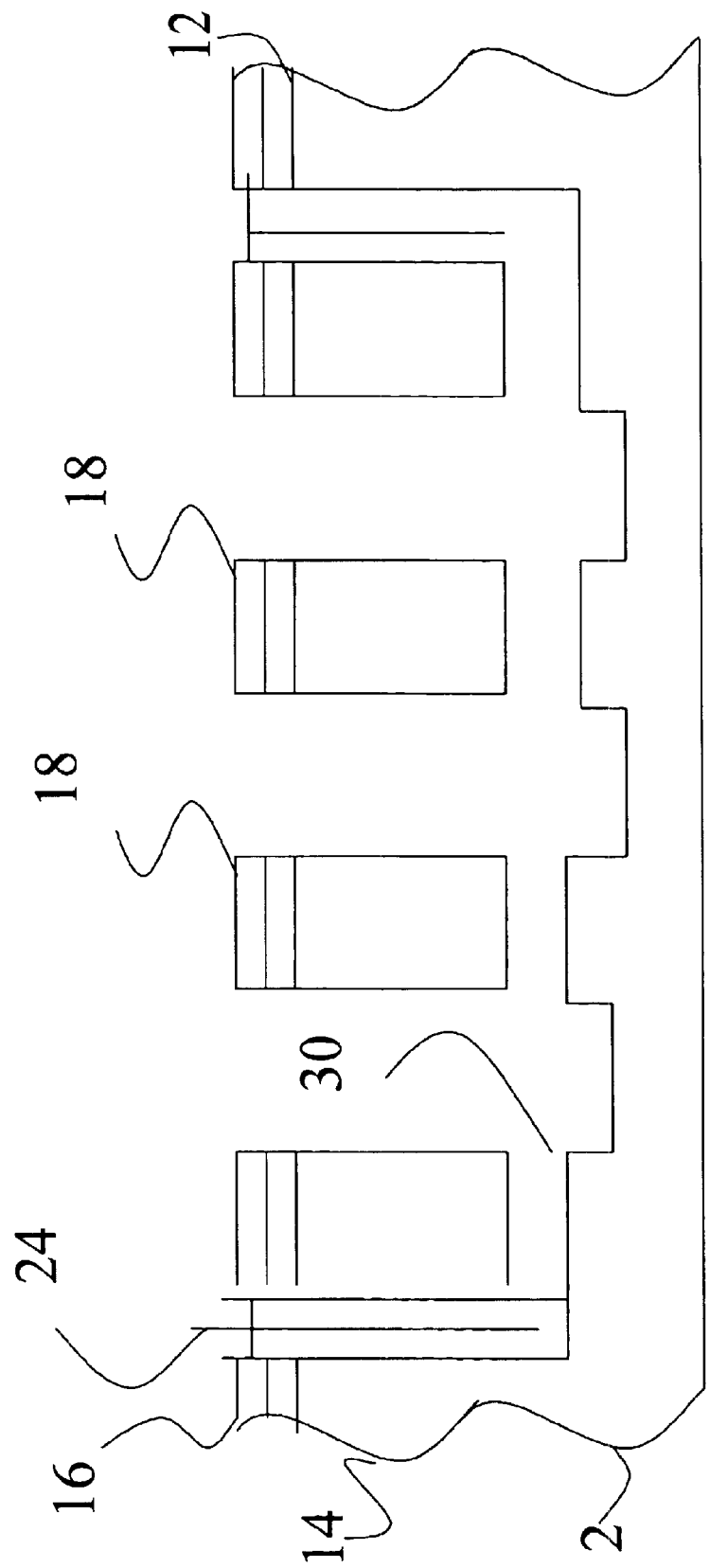

FIG. 12 shows an optional step, depending upon the requirements for the structure. If required, the silicon dioxide layer can be etched, a thicker layer of silicon dioxide can be regrown, and the steps can be repeated as many times as needed to give a wider insulation layer in the widened lateral opening 30.

Figure 13:
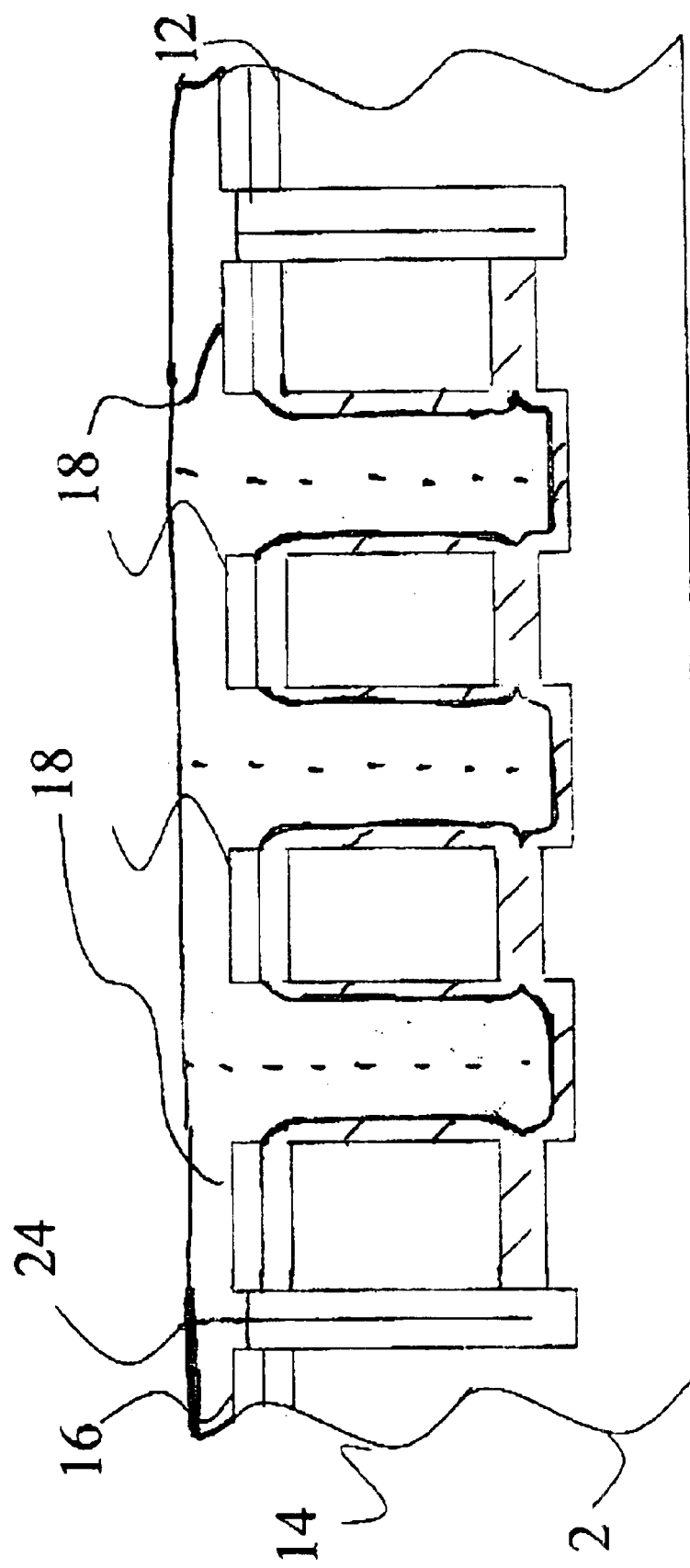

Finally, as shown in FIG. 13, the internal trenches 21 are filled with a conductor such as polysilicon, an insulator such as silicon dioxide or silicon nitride, or a combination of materials to obtain the substrate that is required for device fabrication. (Note: The surface of the deposited layer or layers may be planarized if desired.)

Figure 14:
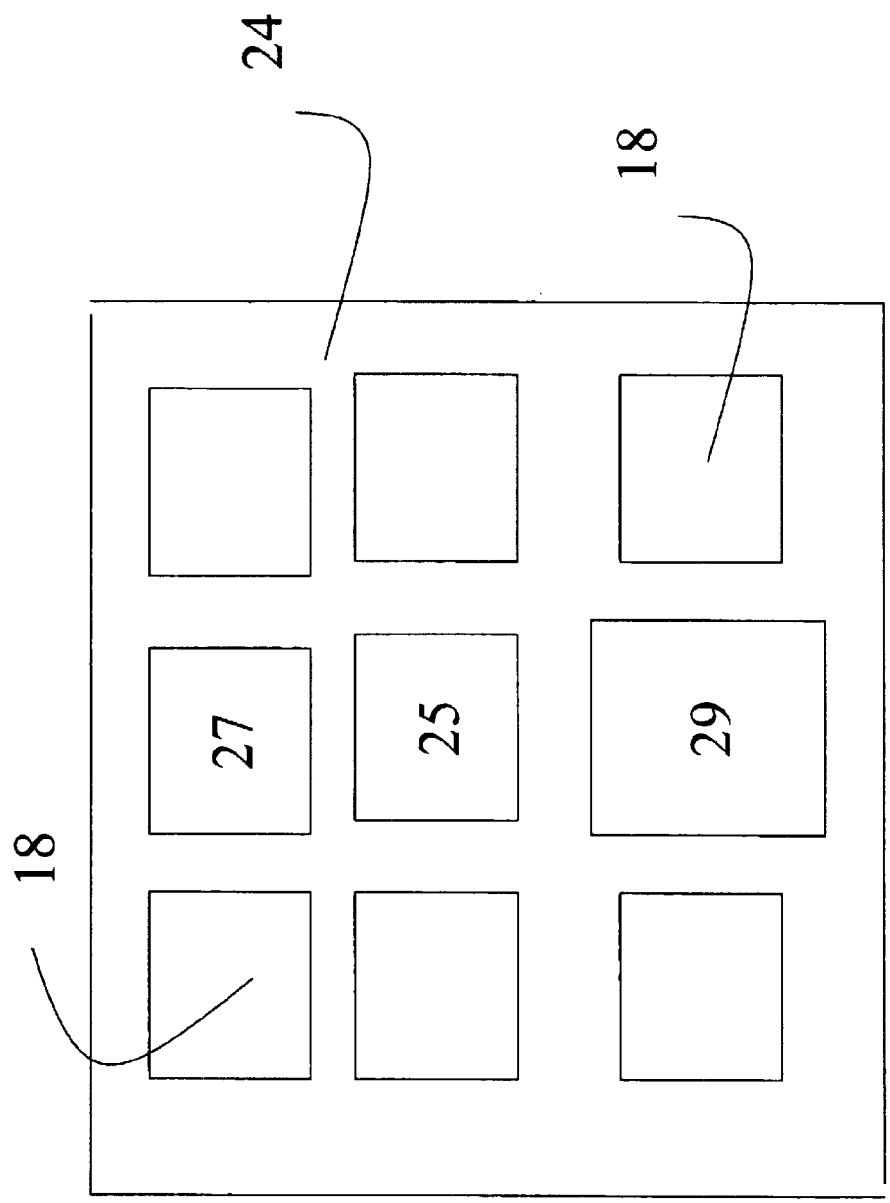

FIG. 14 provides a top view of a device where the pillars 18 are supported by the perimeter oxide 24 and where internal pillar 25 is supported by a silicon dioxide bridge between it and both pillars 27 and 29.

Figure 15:
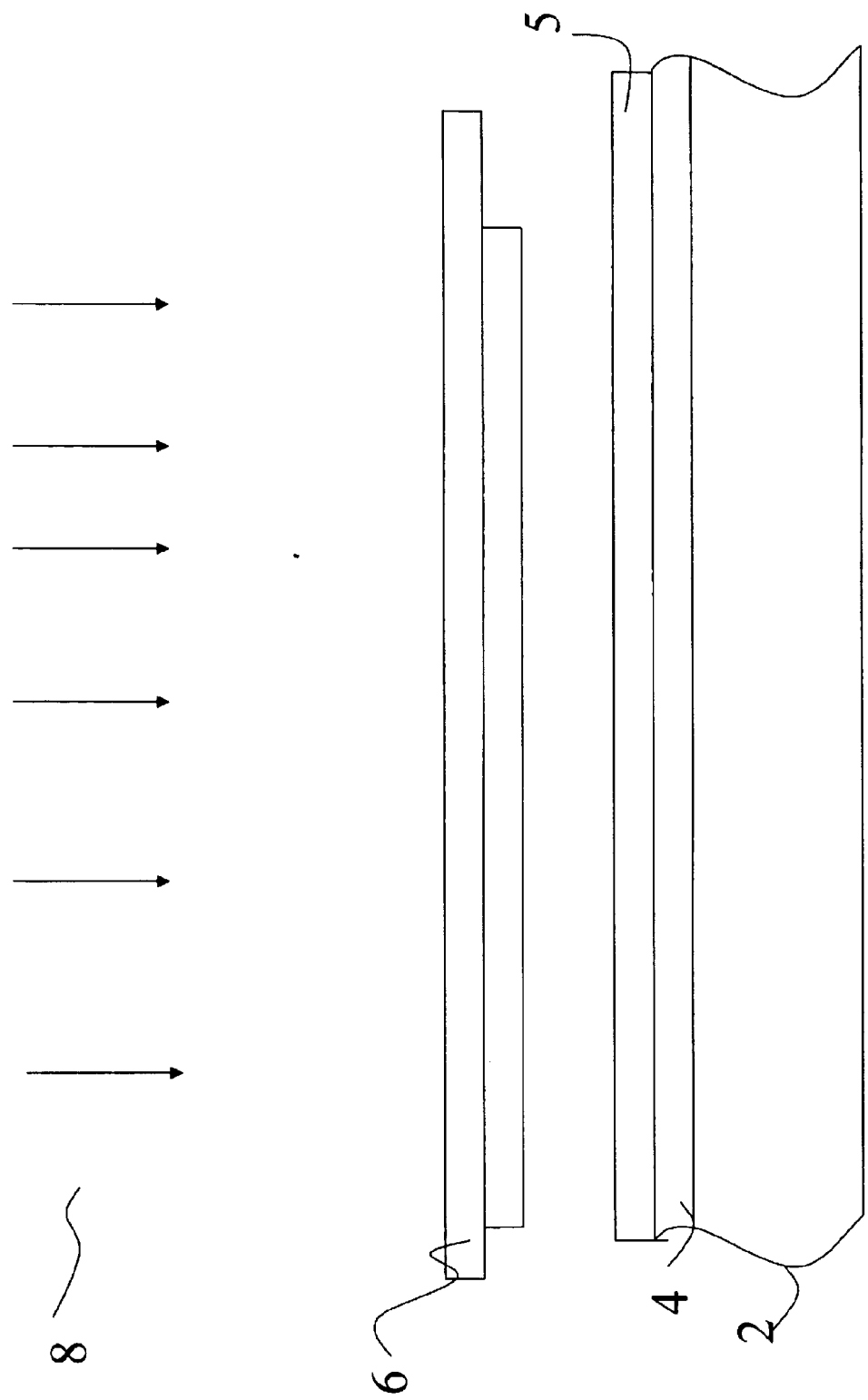
FIGS. 15–17 illustrate the steps necessary to implement a second embodiment.
Figure 16:
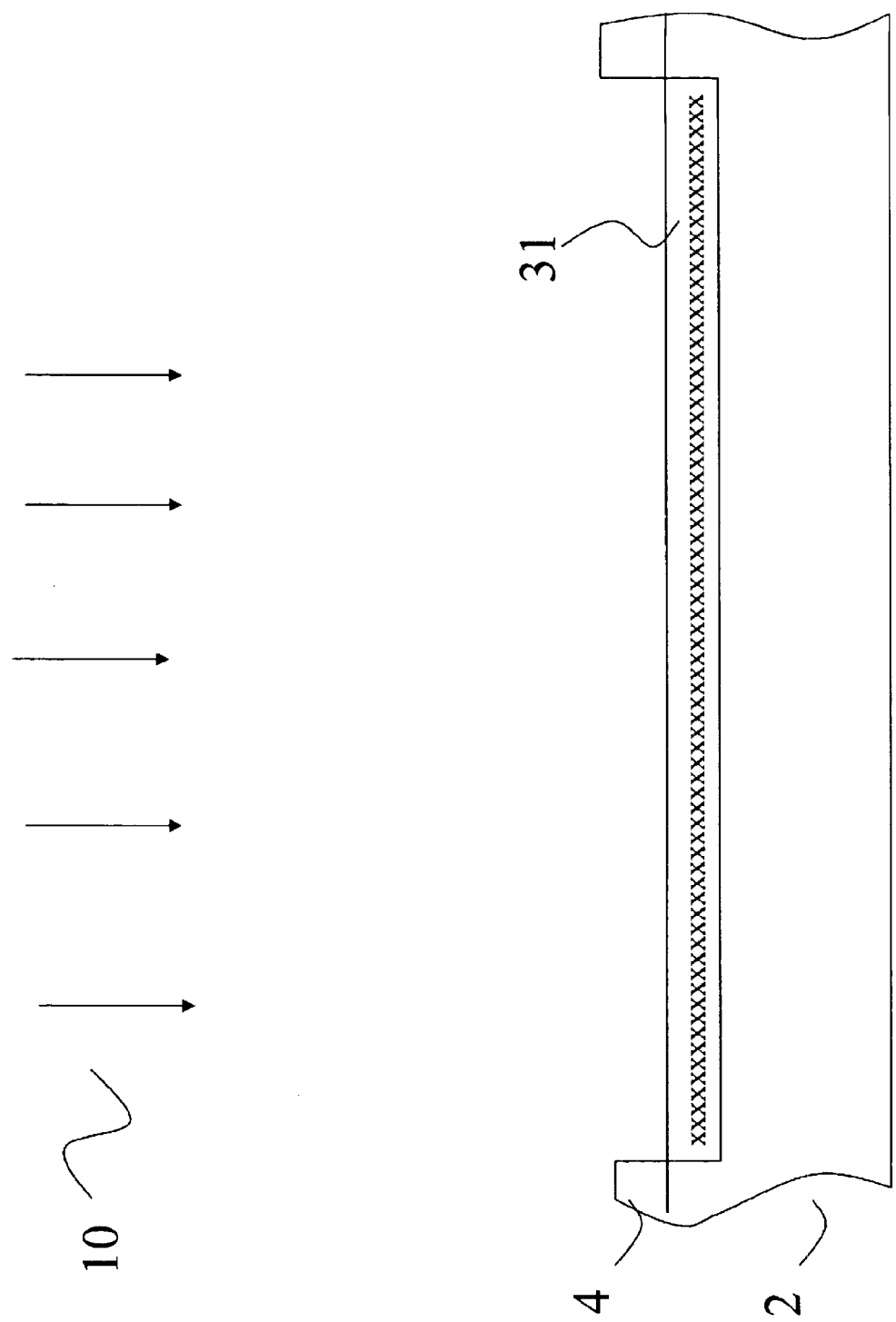
Figure 17:
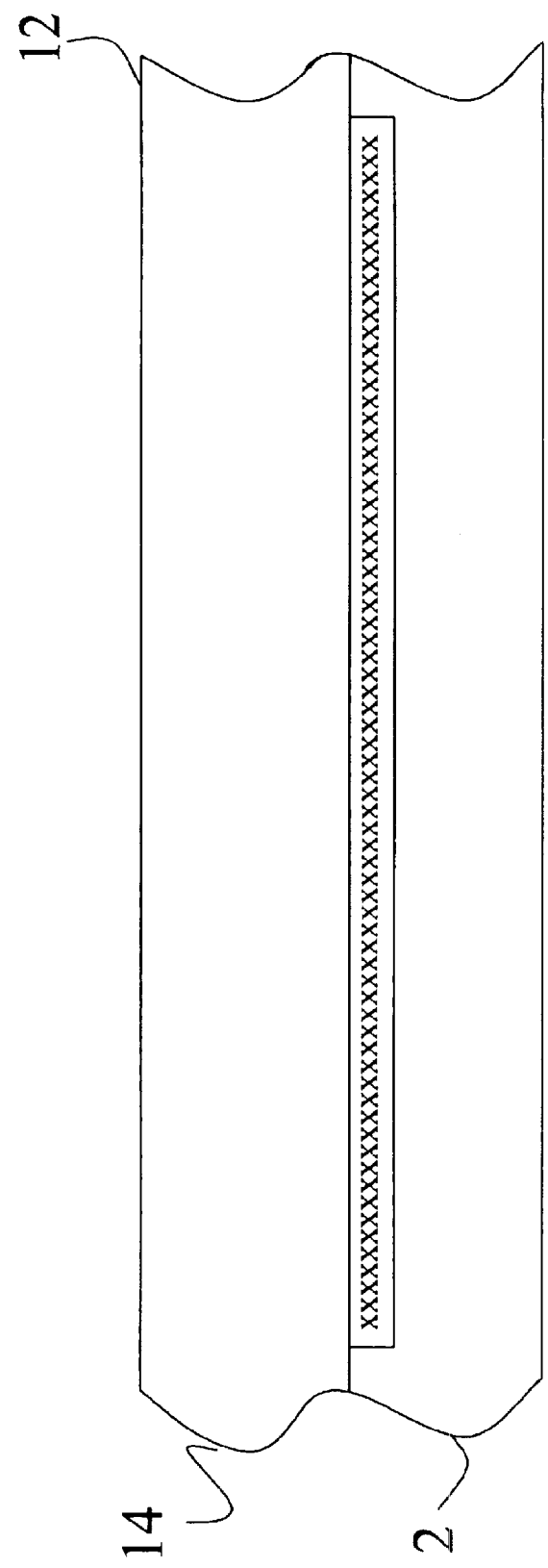

FIGS. 15–17 are the first three steps of a process sequence similar to the process previously discussed. In FIG. 15, an oxide layer is grown on a starting wafer, and the oxide layer is masked and etched. In FIG. 16, a high concentration of n-type atoms is introduced into a selected region 31 using either a thermal predeposition or an ion implantation step. A high concentration of n-type atoms means that the resulting concentration of n-type dopant atoms exceeds ten to the nineteenth atoms per cubic centimeter. In FIG. 17, the oxide layer is removed, and an epitaxial layer of silicon is deposited. The remaining steps are the same as those disclosed in regard to the embodiment of FIGS. 1–14.

Figure 18:
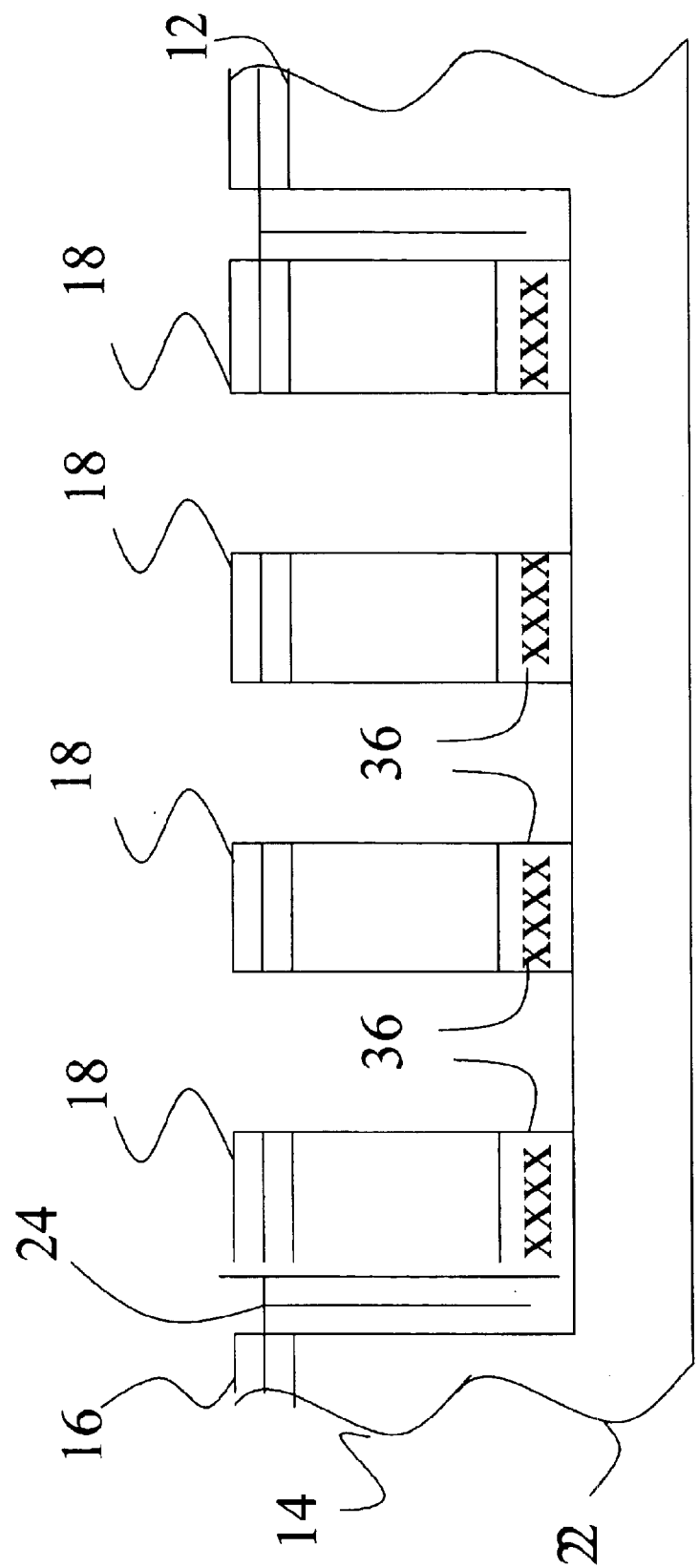
FIGS. 18–20 disclose a third embodiment of the invention.
Figure 19:
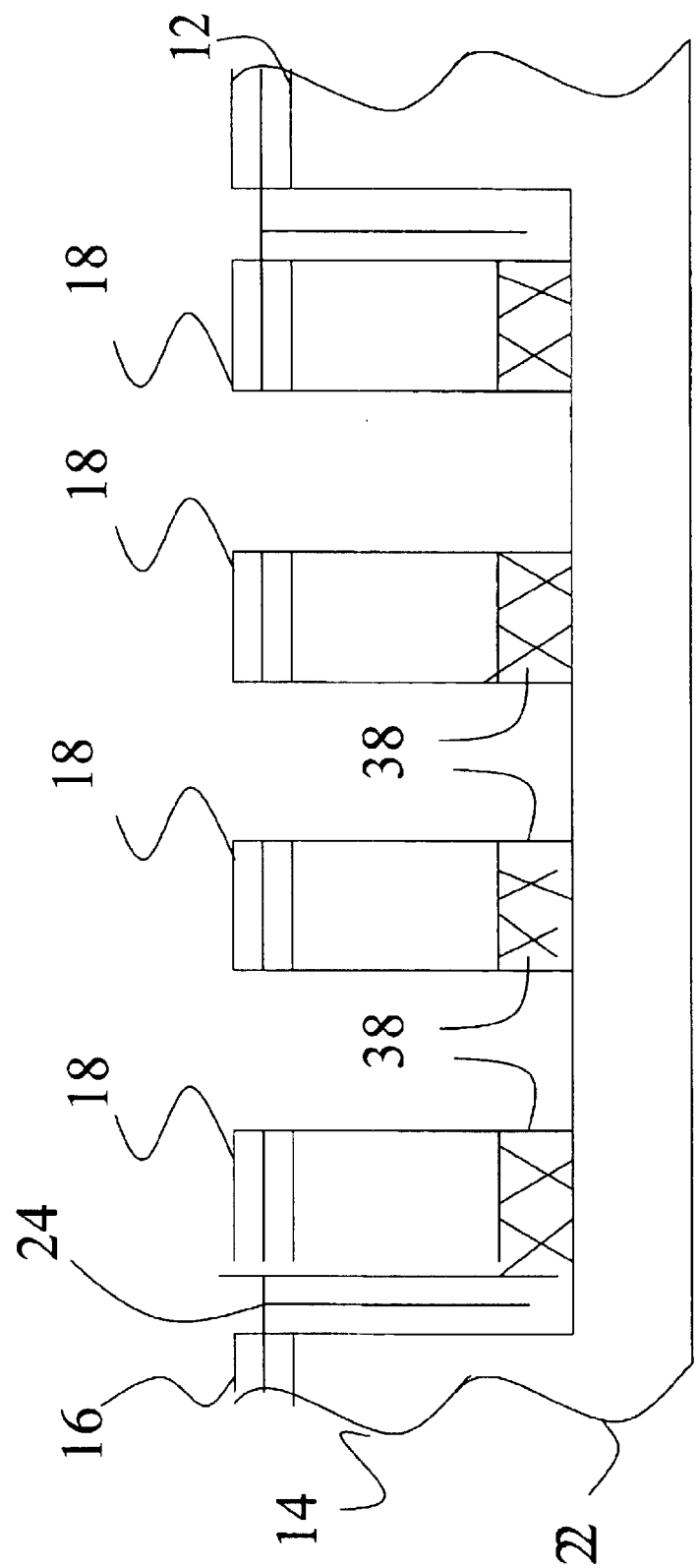
Figure 20:
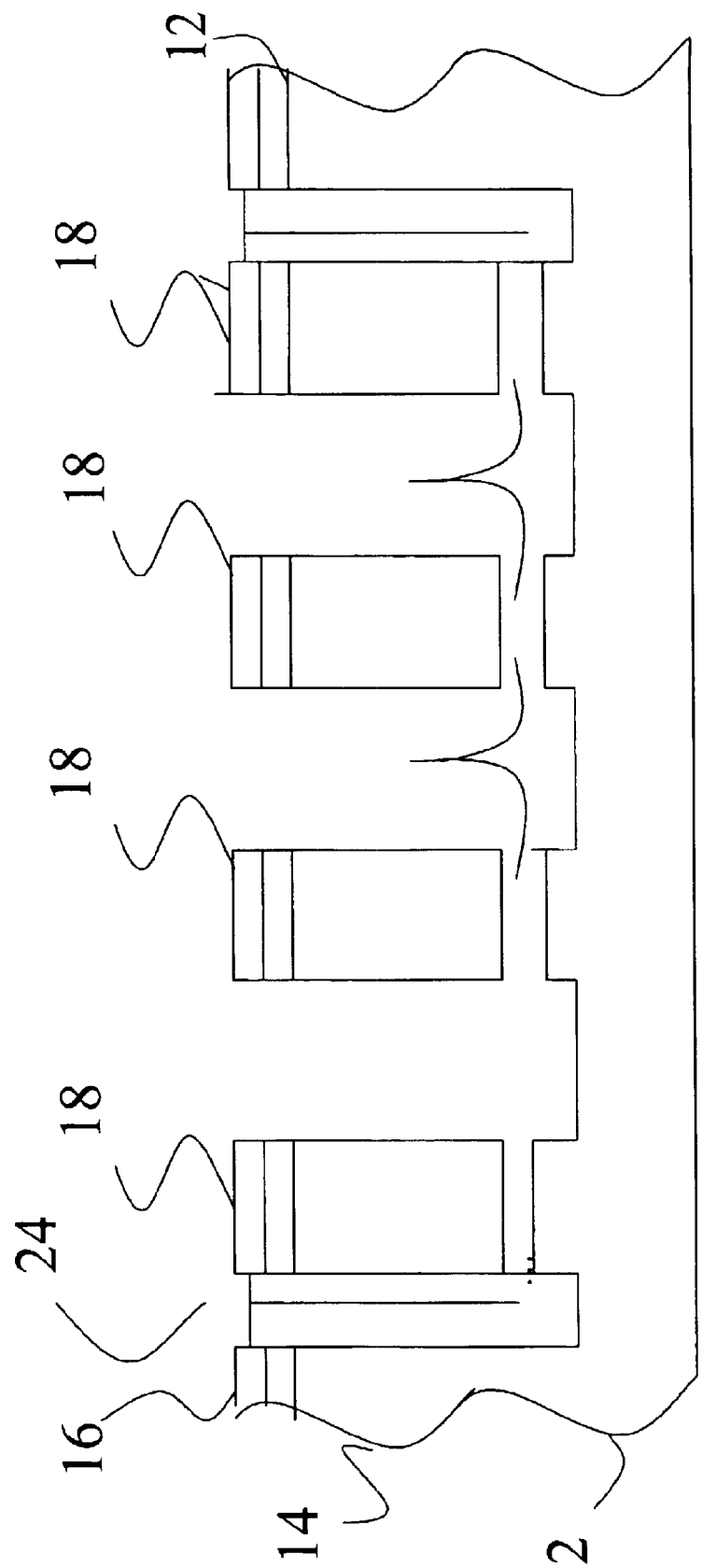

FIGS. 18–20 show the formation of the "porous" silicon using being incorporated into the process sequence. These three steps replace the steps shown in FIGS. 10 and 11 of the first embodiment. In FIG. 18, the n-type regions, 31, are converted to porous silicon using the anodization process. In FIG. 19, the porous silicon is oxidized to form a silicon dioxide layer 38. Finally in FIG. 20, the silicon dioxide layer is removed by etching, leaving the wafer ready for the steps beginning at FIG. 12.

If the starting wafer already has a region of buried oxide present, epitaxial deposition is the first step that needs to be performed. The remainder of the steps are the same as in the first embodiment, except for the etch step that removes the layer below the single crystal regions of silicon. Since there is already a layer of silicon dioxide present, an etchant that etches silicon dioxide is used. The thickness of the resulting layer of silicon dioxide below the single crystal layer of silicon is set by the number of times that the silicon dioxide layer is regrown and then re-etched. Using this oxide growth and etch cycle, the thickness of silicon dioxide can be adjusted between values of about 0.05 um to about 2.0 um.

The isolated regions, pillars or islands can be used to manufacture devices that require isolation from other circuit elements placed on a chip. For example, a power MOSFET IC can be manufactured on a chip containing at best a single isolated region using techniques known in the art. The Power Transistor can be placed on the isolated region and the remainder of the device can be manufactured on the non isolated regions, or visa versa.

Similarly, using techniques known in the art, high frequency analog circuits or high speed digital circuits can also be manufactured on the isolated regions. Additionally, using techniques known in the photodiodes and charge storage device, such as capacitors, can also be manufactured using the isolation regions.

I claim:

1. A method for manufacturing a semiconductor device comprising:

forming an oxide layer on a first surface of an epitaxial layer having a damage layer located at a predetermined depth from the first surface, the damaged layer being in parallel alignment with the first surface;

using the oxide layer as a mask for etching the epitaxial layer to create a plurality of pillars, the plurality of pillars being enclosed in a first area of the top surface of the epitaxial layer, the first area having a predefine perimeter, the plurality of pillars being separated from each other by inner trenches and from the perimeter by a perimeter trench, the inner trenches and perimeter trench extend from the first surface to at least the predetermined depth of damaged layer;

forming an oxide layer that coats the pillars, fills the perimeter trench and coats the sides and bottoms of the inner trenches;

removing the oxide layer from at least the sidewalls and bottom of the inner trenches;

performing an etch step with an etchant that etches preferentially the damaged layer; and forming a layer of silicon dioxide to replace the damaged layer.

2. The method of claim 1 further comprising the steps of removing the layer of silicon dioxide by an etch step and regrowing a thicker layer of silicon dioxide.

3. The method of claim 1 further comprising the step of filling the inner trenches with a conductor such as poly silicon.

4. The method according to claim 1 further comprising the step of filling the inner trenches with an insulator.

5. The method according to claim 4 wherein the step of filling the inner trenches with an insulator comprises the step of filling the inner trenches with an insulator selected from a group that includes silicon dioxide, silicon nitride, or a combination of silicon dioxide and silicon nitride.

6. The method according to claim 5 wherein the semiconductor device includes a power IC and the method further includes the step of manufacturing a power switch on at least one pillar.

7. The method according to claim 5 wherein the semiconductor device includes a power IC and the method further includes the step of manufacturing a logic circuit on at least one pillar.

8. The method according to claim 5 wherein the semiconductor device includes a high frequency analog device and the method further includes the step of manufacturing a high frequency circuit on at least one pillar.

9. The method according to claim 5 wherein the semiconductor device includes a high speed digital device and the method further includes the step of manufacturing a high speed logic circuit on at least one pillar.

10. The method according to claim 1 further including the steps of creating a damaged layer at the predetermined depth of the epitaxial layer.

11. The method according to claim 10 wherein the steps of creating a damaged layer at the predetermined depth of the epitaxial layer comprises;

growing an oxide layer on the surface of a semiconductor layer such as a starting wafer;

masking and etching the oxide layer to define at least the first area; and implanting ions at size and an energy sufficient to damage a region of the semiconductor layer beneath the oxide layer, that coincides with the first area.

12. The method according to claim 11 wherein the steps of creating a damaged layer at the predetermined depth of the epitaxial layer comprises;

growing an oxide layer on the surface of a semiconductor layer such as a starting wafer;

masking and etching the oxide layer to define at least the first area;

implanting N type ions into the semiconductor layer beneath the oxide layer; and diffusing the implanted ions to form a damaged layer comprising a heavily doped N type region.

13. The method according to claim 11 wherein the steps of creating a damaged layer at the predetermined depth of the epitaxial layer comprises;

growing an oxide layer on the surface of a semiconductor layer such as a starting wafer, the semiconductor layer having a pre-deposition of ions;

masking and etching the oxide layer to define at least the first area;

thermal pre-positioning a high concentration of dopant atoms in at least the first area; and diffusing the pre-positioned dopant atoms to form a damaged layer comprising a heavily doped N type region.

14. A method for manufacturing a semiconductor device comprising:

forming an oxide layer on a first surface of an epitaxial layer having a damage layer located at a predetermined depth from the first surface, the damaged layer being in parallel alignment with the first surface;

using the oxide layer as a mask for etching the epitaxial layer to create a plurality of pillars, the plurality of pillars being enclosed in a first area of the top surface of the epitaxial layer, the first area having a predefine perimeter, the plurality of pillars being separated from each other by inner trenches and from the perimeter by a perimeter trench, the inner trenches and perimeter trench extend from the first surface to beyond the predetermined depth of damaged layer;

forming an oxide layer that coats the pillars, fills the perimeter trench and coats the sides and bottoms of the inner trenches;

removing the oxide layer from at least the sidewalls and bottom of the inner trenches;

forming a galvanic cell at the damaged layer;

using an HF base etch convert the damaged layer to a layer of porous silicon;

oxidizing the layer of porous silicon;

removing the layer of oxidized porous silicon; and growing a layer of silicon dioxide to replace the layer of oxidized porous silicon.

15. The method of claim 14 further comprising the steps of removing the layer of silicon dioxide by an etch step and regrowing a thicker layer of silicon dioxide.

16. The method of claim 14 further comprising the step of filling the inner trenches with a conductor such as poly silicon.

17. The method according to claim 14 further comprising the step of filling the inner trenches with an insulator.

18. The method according to claim 17 wherein the step of filling the inner trenches with an insulator comprises the step of filling the inner trenches with an insulator selected from a group that includes silicon dioxide, silicon nitride, or a combination of silicon dioxide and silicon nitride.

19. The method according to claim 18 wherein the semiconductor device includes a power IC and the method further includes the step of manufacturing a power switch on at least one pillar.

20. The method according to claim 18 wherein the semiconductor device includes a power IC and the method further includes the step of manufacturing a logic circuit on at least one pillar.

21. The method according to claim 18 wherein the semiconductor device includes a high frequency analog device and the method further includes the step of manufacturing a high frequency circuit on at least one pillar.

22. The method according to claim 18 wherein the semiconductor device includes a high speed digital device and the method further includes the step of manufacturing a high speed logic circuit on at least one pillar.

23. The method according to claim 14 further including the steps of creating a damaged layer at the predetermined depth of the epitaxial layer.

24. The method according to claim 23 wherein the steps of creating a damaged layer at the predetermined depth of the epitaxial layer comprises;
   growing an oxide layer on the surface of a semiconductor layer such as a starting wafer;
   masking and etching the oxide layer to define at least the first area; and
   implanting ions at size and an energy sufficient to damage a region of the semiconductor layer beneath the oxide layer, that coincides with the first area.

25. The method according to claim 23 wherein the steps of creating a damaged layer at the predetermined depth of the epitaxial layer comprises;
   growing an oxide layer on the surface of a semiconductor layer such as a starting wafer;
   masking and etching the oxide layer to define at least the first area;
   implanting N type ions into the semiconductor layer beneath the oxide layer; and
   diffusing the implanted ions to form a damaged layer comprising a heavily doped N type region.

26. The method according to claim 23 wherein the steps of creating a damaged layer at the predetermined depth of the epitaxial layer comprises;
   growing an oxide layer on the surface of a semiconductor layer such as a starting wafer, the semiconductor layer having a pre-deposition of ions;
   masking and etching the oxide layer to define at least the first area;
   thermal pre-positioning a high concentration of dopant atoms in at least the first area; and
   diffusing the pre-positioned dopant atoms to form a damaged layer comprising a heavily doped N type region.

27. A method for manufacturing a semiconductor device comprising:
   forming an oxide layer on a first surface of an epitaxial layer having a damage layer located at a predetermined depth from the first surface, the damaged layer being in parallel alignment with the first surface;
   using the oxide layer as a mask for etching the epitaxial layer to create a pillar, the pillar being enclosed in a first area of the top surface of the epitaxial layer, the first area having a predefine perimeter, the pillar being separated from the perimeter by a perimeter trench, on at least a first side by inner trenches on the remaining sides, the trenches extend from the first surface to beyond the predetermined depth of damaged layer;
   forming an oxide layer that coats the pillar, fills the perimeter trench, and coats the sides and bottoms of the inner trenches;
   removing the oxide layer from at least the sidewalls and bottom of the inner trenches;
   performing an etch step with an etchant that etches preferentially the damaged layer; and
   growing a layer of silicon dioxide to replace the damaged layer.

28. The method of claim 27 further comprising the steps of removing the layer of silicon dioxide by an etch step and regrowing a thicker layer of silicon dioxide.

29. The method of claim 27 further comprising the step of filling the inner trenches with a conductor such as poly silicon.

30. The method according to claim 27 further comprising the step of filling the inner trenches with an insulator.

31. The method according to claim 30 wherein the step of filling the inner trenches with an insulator comprises the step of filling the inner trenches with an insulator selected from a group that includes silicon dioxide, silicon nitride, or a combination of silicon dioxide and silicon nitride.

32. The method according to claim 31 wherein the semiconductor device includes a power IC and the method further includes the step of manufacturing a power switch on at least one pillar.

33. The method according to claim 31 wherein the semiconductor device includes a power IC and the method further includes the step of manufacturing a logic circuit on at least one pillar.

34. The method according to claim 31 wherein the semiconductor device includes a high frequency analog device and the method further includes the step of manufacturing a high frequency circuit on at least one pillar.

35. The method according to claim 31 wherein the semiconductor device includes a high speed digital device and the method further includes the step of manufacturing a high speed logic circuit on at least one pillar.

36. The method according to claim 27 further including the steps of creating a damaged layer at the predetermined depth of the epitaxial layer.

37. The method according to claim 36 wherein the steps of creating a damaged layer at the predetermined depth of the epitaxial layer comprises;
   growing an oxide layer on the surface of a semiconductor layer such as a starting wafer;
   masking and etching the oxide layer to define at least the first area; and
   implanting ions at size and an energy sufficient to damage a region of the semiconductor layer beneath the oxide layer, that coincides with the first area.

38. The method according to claim 36 wherein the steps of creating a damaged layer at the predetermined depth of the epitaxial layer comprises;
   growing an oxide layer on the surface of a semiconductor layer such as a starting wafer;
   masking and etching the oxide layer to define at least the first area;
   implanting N type ions into the semiconductor layer beneath the oxide layer; and
   diffusing the implanted ions to form a damaged layer comprising a heavily doped N type region.

39. The method according to claim 36 wherein the steps of creating a damaged layer at the predetermined depth of the epitaxial layer comprises;
   growing an oxide layer on the surface of a semiconductor layer such as a starting wafer, the semiconductor layer having a pre-deposition of ions;
   masking and etching the oxide layer to define at least the first area;
   thermal pre-positioning a high concentration of dopant atoms in at least the first area; and diffusing the pre-positioned dopant atoms to form a damaged layer comprising a heavily doped N type region.

40. A method for manufacturing a semiconductor device comprising:

forming an oxide layer on a first surface of an epitaxial layer having a damage layer located at a predetermined depth from the first surface, the damaged layer being in parallel alignment with the first surface;

using the oxide layer as a mask for etching the epitaxial layer to create a pillar, the pillar being enclosed in a first area of the top surface of the epitaxial layer, the first area having a predefined perimeter, the pillar being separated from the perimeter by a perimeter trench along a first side, and with internal trenches on the second side, the inner trenches and perimeter trench extend from the first surface to beyond the predetermined depth of damaged layer;

forming an oxide layer that coats the pillar, fills the perimeter trench, and coats the sides and bottoms of the inner trenches;

removing the oxide layer from at least the sidewalls and bottom of the inner trenches;

forming a galvanic cell at the damaged layer;

using an HF base etch convert the damaged layer to a layer of porous silicon;

oxidizing the layer of porous silicon;

removing the layer of oxidized porous silicon; and growing a layer of silicon dioxide to replace the layer of oxidized porous silicon.

41. The method of claim 40 further comprising the steps of removing the layer of silicon dioxide by an etch step and regrowing a thicker layer of silicon dioxide.

42. The method of claim 40 further comprising the step of filling the inner trenches with a conductor such as poly silicon.

43. The method according to claim 40 further comprising the step of filling the inner trenches with an insulator.

44. The method according to claim 43 wherein the step of filling the inner trenches with an insulator comprises the step of filling the inner trenches with an insulator selected from a group that includes silicon dioxide, silicon nitride, or a combination of silicon dioxide and silicon nitride.

45. The method according to claim 44 wherein the semiconductor device includes a power IC and the method further includes the step of manufacturing a power switch on at least one pillar.

46. The method according to claim 44 wherein the semiconductor device includes a power IC and the method further includes the step of manufacturing a logic circuit on at least one pillar.

47. The method according to claim 44 wherein the semiconductor device includes a high frequency analog device and the method further includes the step of manufacturing a high frequency circuit on at least one pillar.

48. The method according to claim 44 wherein the semiconductor device includes a high speed digital device and the method further includes the step of manufacturing a high speed logic circuit on at least one pillar.

49. The method according to claim 40 further including the steps of creating a damaged layer at the predetermined depth of the epitaxial layer.

50. The method according to claim 49 wherein the steps of creating a damaged layer at the predetermined depth of the epitaxial layer comprises;

growing an oxide layer on the surface of a semiconductor layer such as a starting wafer;

masking and etching the oxide layer to define at least the first area; and implanting ions at size and an energy sufficient to damage an area of the semiconductor layer beneath the oxide layer, that coincides with the first area.

51. The method according to claim 49 wherein the steps of creating a damaged layer at the predetermined depth of the epitaxial layer comprises;

growing an oxide layer on the surface of a semiconductor layer such as a starting wafer;

masking and etching the oxide layer to define at least the first area;

implanting N type ions into the semiconductor layer beneath the oxide layer; and diffusing the implanted ions to form a damaged layer comprising a heavily doped N type region.

52. The method according to claim 49 wherein the steps of creating a damaged layer at the predetermined depth of the epitaxial layer comprises;

growing an oxide layer on the surface of a semiconductor layer such as a starting wafer, the semiconductor layer having a pre-deposition of ions;

masking and etching the oxide layer to define at least the first area;

thermal pre-positioning a high concentration of dopant atoms in at least the first area; and diffusion the implanted ions to form a damaged layer comprising a heavily doped N type region.

* * * * *